(12) United States Patent
Lin

(10) Patent No.: US 7,672,089 B2
(45) Date of Patent: Mar. 2, 2010

(54) CURRENT-PERPENDICULAR-TO-PLANE SENSOR WITH DUAL KEEPER LAYERS

(75) Inventor: Tsann Lin, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 493 days.

(21) Appl. No.: 11/611,828

(22) Filed: Dec. 15, 2006

(65) Prior Publication Data

US 2008/0144234 A1    Jun. 19, 2008

(51) Int. Cl.
*G11B 5/39* (2006.01)
(52) U.S. Cl. .............................. 360/324.11; 360/324.2
(58) Field of Classification Search .............. 360/324.1, 360/324.11, 324.12, 324.2
See application file for complete search history.

(56) References Cited

U.S. PATENT DOCUMENTS

| | | | |
|---|---|---|---|
| 5,796,561 A | 8/1998 | Mauri | 360/113 |
| 6,010,781 A | 1/2000 | Aoshima et al. | 428/332 |
| 6,031,692 A | 2/2000 | Kawawake et al. | 360/113 |
| 6,057,049 A | 5/2000 | Fuke et al. | 428/700 |
| 6,315,839 B1 | 11/2001 | Pinarbasi et al. | 148/108 |
| 6,455,178 B1 | 9/2002 | Fuke et al. | 428/700 |
| 6,548,186 B1 | 4/2003 | Carey et al. | 428/611 |
| 6,580,589 B1 | 6/2003 | Gill | 360/324.11 |
| 6,735,058 B2 | 5/2004 | Lin et al. | 360/319 |
| 6,809,909 B2 | 10/2004 | Hou et al. | 360/324.11 |
| 6,977,801 B2 | 12/2005 | Carey et al. | 360/324.11 |
| 2003/0206379 A1* | 11/2003 | Lin et al. | 360/319 |
| 2005/0047027 A1* | 3/2005 | Lin | 360/324.1 |
| 2005/0118458 A1* | 6/2005 | Slaughter et al. | 428/692 |
| 2005/0243476 A1* | 11/2005 | Gill | 360/324.11 |

(Continued)

FOREIGN PATENT DOCUMENTS

JP        8-249616        9/1996

OTHER PUBLICATIONS

Rhee "Dependence of Magnetic tunnel junction properties on tunnel barrier roughness" Journal of Magnetism and Magnetic Materials 304 (2006).

(Continued)

*Primary Examiner*—Jefferson Evans
(74) *Attorney, Agent, or Firm*—Zilka-Kotab, PC

(57) ABSTRACT

This invention provides a CPP TMR or GMR sensor with an amorphous ferromagnetic lower keeper layer and a crystalline ferromagnetic upper keeper layer. The amorphous ferromagnetic lower keeper layer strongly exchange-couples to an underlying antiferromagnetic pinning layer and planarizes its rough surface. The crystalline ferromagnetic upper keeper layer strongly antiparallel-couples to an adjacent ferromagnetic reference layer across a nonmagnetic spacer layer. The amorphous ferromagnetic lower keeper layer is preferably made of a Co—Fe—B alloy film with an Fe content high enough to ensure strong exchange-coupling to the underlying antiferromagnetic pinning layer, and with a B content high enough to ensure the formation of an amorphous phase for planarizing an otherwise rough surface due to the underlying antiferromagnetic pinning layer. The crystalline ferromagnetic upper keeper layer is preferably made of a Co—Fe alloy film with an Fe content low enough to ensure strong antiparallel-coupling to the adjacent ferromagnetic reference layer across the nonmagnetic spacer layer. The sensor is annealed at temperatures low enough to prevent the amorphous phase from transforming into a polycrystalline phase, but also high enough to maximize TMR.

22 Claims, 9 Drawing Sheets

U.S. PATENT DOCUMENTS

| | | |
|---|---|---|
| 2006/0002038 A1 | 1/2006 | Gill .................. 360/324.11 |
| 2006/0044708 A1 | 3/2006 | Gill .................. 360/324.12 |
| 2006/0067012 A1 | 3/2006 | Li et al. ............ 360/324.11 |
| 2006/0168797 A1 | 8/2006 | Li et al. ............ 29/603.07 |
| 2007/0217082 A1* | 9/2007 | Lin .................. 360/324.11 |
| 2008/0080101 A1* | 4/2008 | Mauri et al. ....... 360/324.2 |

OTHER PUBLICATIONS

Cardoso et al. "Double-Barrier Magnetic Tunnel Junction with GeSbTe Thermal Barriers for Improved Thermally Assissted magnetoresistive random access memory cells" Journal of Applied Physics 99 2006.

Carey et al. Improved Corrosion Resistance of IrMn Antiferromagnets for Spin Valve Applications by Alloying with Cr and Ru Intermag Europe 2002 Digest of Technical Papers IEEE International Magnetics conference.

Cardoso et al. "Characterization of CoFeB Electrodes for Tunnel Junctions" Journal of Applied Physics 97 2005.

* cited by examiner

Legend:
Open triangles %75Co-24%Fe-%1B
Closed triangles 74%Co-23%Fe-3%B
Open circles 72%Co-22%Fe-6%B
Closed circles 70%Co-22%Fe-8%B

CURRENT-PERPENDICULAR-TO-PLANE SENSOR WITH DUAL KEEPER LAYERS

FIELD OF THE INVENTION

The present invention relates to a current-perpendicular-to-plane (CPP) tunneling magnetoresistance (TMR) or giant magnetoresistance (GMR) sensor, and more particularly to a CPP TMR or GMR sensor that has multiple keeper layers.

BACKGROUND OF THE INVENTION

The heart of a computer is a non-volatile storage device that is referred to as a magnetic disk drive. The magnetic disk drive includes a magnetic disk, and write and read heads. The write and read heads are supported by a slider that is mounted on a suspension arm. When the magnetic disk rotates, an actuator swings the suspension arm to place the write and read heads over selected circular tracks on the surface of the rotating magnetic disk. An air flow generated by the rotation of the magnetic disk causes an air bearing surface (ABS) of the slider to fly at a very low elevation (fly height) over the surface of the rotating magnetic disk. The write and read heads write magnetic transitions to and read magnetic transitions from the rotating magnetic disk, respectively. Processing circuitry connected to the write and read heads then operates according to a computer program to implement writing and reading functions.

The write head includes a coil embedded in an insulation stack that is sandwiched between main and auxiliary poles. The main and auxiliary poles are magnetically coupled at a back gap and are coated with an overcoat. A write current conducted to the coil induces a magnetic flux in the main pole that causes a magnetic field to write the aforementioned magnetic impressions to the rotating magnetic disk.

The read head includes a CPP TMR or GMR sensor electrically connected with top and bottom electrodes, but electrically insulated by insulating films from bias stacks at two side regions. A sense current conducted through the top electrode, CPP TMR or GMR sensor, and bottom electrode allows changes of TMR or GMR resistance to be read in response to external magnetic fields of magnetic transitions from the rotating magnetic disk.

The CPP TMR sensor typically comprises an $AlO_x$, $TiO_x$ or $MgO_x$ barrier layer, while the CPP GMR sensor typically comprises a Cu spacer layer wherein some O is incorporated. After annealing at 360° C. or higher, the $MgO_x$ TMR sensor exhibits a TMR coefficient much higher than the $AlO_x$ and $TiO_x$ TMR sensors, and thus appears to be the most attractive for the use in the read head. A currently used $MgO_x$ TMR sensor includes a 1 nm thick nonmagnetic $MgO_x$ barrier layer overlying a lower structure and underlying an upper structure. The lower structure comprises a 3 nm thick nonmagnetic Ta adhesion layer, a 15 nm thick antiferromagnetic 46% Pt-54% Mn (all compositions are given in atomic percent) alloy pinning layer, a 2.5 nm thick ferromagnetic 70% Co-30% Fe alloy keeper layer, a 0.8 nm thick nonmagnetic Ru spacer layer, a 3 nm thick ferromagnetic 60% Co-20% Fe-20% B alloy reference layer. The upper structure comprises a 3 nm ferromagnetic 60% Co-20%-Fe-20% B alloy sense layer and an 8 nm thick nonmagnetic Ta cap layer.

To ensure proper sensor operation, magnetizations of the Co—Fe alloy keeper and Co—Fe—B alloy reference layers must be rigidly pinned in opposite transverse directions perpendicular to an air bearing surface (ABS), while the magnetization of the sense layer is preferably oriented in a longitudinal direction parallel to the ABS after applying a sense current. This rigid pinning is achieved through a high unidirectional anisotropy field ($H_{UA}$) induced by exchange coupling between the antiferromagnetic Pt—Mn alloy pinning and ferromagnetic Co—Fe alloy keeper layers in a transverse direction, and through a high antiparallel coupling field ($H_{AP}$) induced by antiparallel coupling between the ferromagnetic Co—Fe alloy keeper and Co—Fe—B alloy reference layers across the Ru spacer layer in two opposite transverse directions. To achieve optimal TMR responses, a demagnetizing field ($H_D$) induced by the net magnetic moment of the Co—Fe alloy keeper and Co—Fe alloy reference layers must balance with a ferromagnetic coupling field ($H_F$) across the $MgO_x$ barrier layer. This field balance is preferably achieved with low $H_D$ and $H_F$ to minimize non-uniform field distributions particularly at sensor edges.

In order to improve thermal stability caused by unwanted hysteretic magnetization rotations of the Co—Fe alloy keeper and Co—Fe—B alloy reference layer, the $MgO_x$ TMR sensor has recently been modified by adding a 2 nm thick Ru seed layer on top of the Ta adhesion layer and replacing the Pt—Mn alloy pinning layer with a 6 nm thick antiferromagnetic 22% Ir-78% Mn alloy pinning layer. The Ru seed layer is not needed in the Pt—Mn alloy TMR sensor because the Pt—Mn alloy pinning layer only needs annealing for developing its antiferromagnetism through a transformation from a nonmagnetic face-centered-cubic (fcc) phase to an antiferromagnetic face-centered-tetragonal (fct) phase; and, the crystalline planes of the Pt—Mn alloy are randomly oriented on the Ta adhesion layer. However, the Ru seed layer is needed in the Ir—Mn alloy sensor since the Ru seed layer facilitates fcc {111} crystalline planes of the Ir—Mn alloy pinning layer to lie in parallel to the interface between the Ru seed layer and the Ir—Mn alloy pinning layer for developing antiferromagnetism in the Ir—Mn alloy pinning layer. As a result, exchange coupling between the Ir—Mn alloy pinning and Co—Fe alloy keeper layers induces $H_{UA}$ much higher, and an easy axis coercivity $H_{CE}$ much lower, than that between the Pt—Mn alloy pinning and Co—Fe alloy keeper layers. The high $H_{UA}$ ensures rigid pinning, while the low $H_{CE}$ minimizes unwanted hysteretic magnetization rotations.

However, in contrast to the Pt—Mn alloy pinning layer exhibiting a smooth surface topography, the Ir—Mn alloy pinning layer exhibits a rough surface topography inevitably induced by its strong fcc {111} crystalline texture. This rough surface topography causes the lower structure to grow with rough interfaces and the $MgO_x$ barrier layer to exhibit a wavy profile. As a result, with a deteriorated TMR effect, the Ir—Mn alloy TMR sensor exhibits a higher $H_F$ and a lower TMR coefficient ($\Delta R_T/R_J$, where $R_T$ is a tunneling resistance and $R_J$ is a junction resistance) than the Pt—Mn alloy TMR sensor.

A plasma treatment has been applied to all the layers in the lower structure for smoothing interfaces. However, this smoothing technique has the following drawbacks: it deteriorates microstructural effects when applied to the surface of the Ru seed layer; interrupts the growth of the preferred crystalline texture when applied to the Ir—Mn alloy pinning layer; destroys the desired unidirectional anisotropy when applied to the interface at the Ir—Mn alloy pinning layer; reduces the strength of antiparallel coupling when applied to surfaces of the Co—Fe alloy keeper and Ru spacer layers; and, diminishes tunneling effects when applied to the surface of the Co—Fe—B alloy reference layer. In other words, this smoothing technique is not feasible.

Therefore, there is a strong felt need for a sensor structure, especially a TMR structure, that can provide a smooth, planar surface for the barrier layer, while at the same time exhibiting strong exchange coupling with the AFM layer and maintaining a high TMR coefficient.

SUMMARY OF THE INVENTION

The present invention provides a CPP TMR or GMR sensor with an amorphous ferromagnetic lower keeper layer and a crystalline ferromagnetic upper keeper layer. The amorphous ferromagnetic lower keeper layer strongly exchange-couples to an underlying antiferromagnetic pinning layer and planarizes an otherwise rough surface of layers lying on top of the AFM pinning layer. The crystalline ferromagnetic upper keeper layer strongly antiparallel-couples to an adjacent ferromagnetic reference layer across a nonmagnetic spacer layer.

The amorphous ferromagnetic lower keeper layer is preferably made of a Co—Fe—B alloy film with an Fe content high enough to ensure strong exchange-coupling to the underlying antiferromagnetic pinning layer, but with a B content high enough to ensure the formation of an amorphous phase for planarizing the rough surface of overlayers above the antiferromagnetic pinning layer. The crystalline ferromagnetic upper keeper layer is preferably made of a Co—Fe alloy film with an Fe content low enough to ensure strong antiparallel-coupling with the adjacent ferromagnetic reference layer across the nonmagnetic spacer layer.

Additionally, the CPP TMR sensor is annealed at temperatures low enough to prevent the amorphous phase from transforming into a polycrystalline phase, but also high enough to maximize TMR effects.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE INVENTION

The following is a description of various embodiments presently contemplated for carrying out this invention. This description is made for the purpose of illustrating the general principles of this invention and is not meant to limit the inventive concepts claimed herein.

Figure 1:
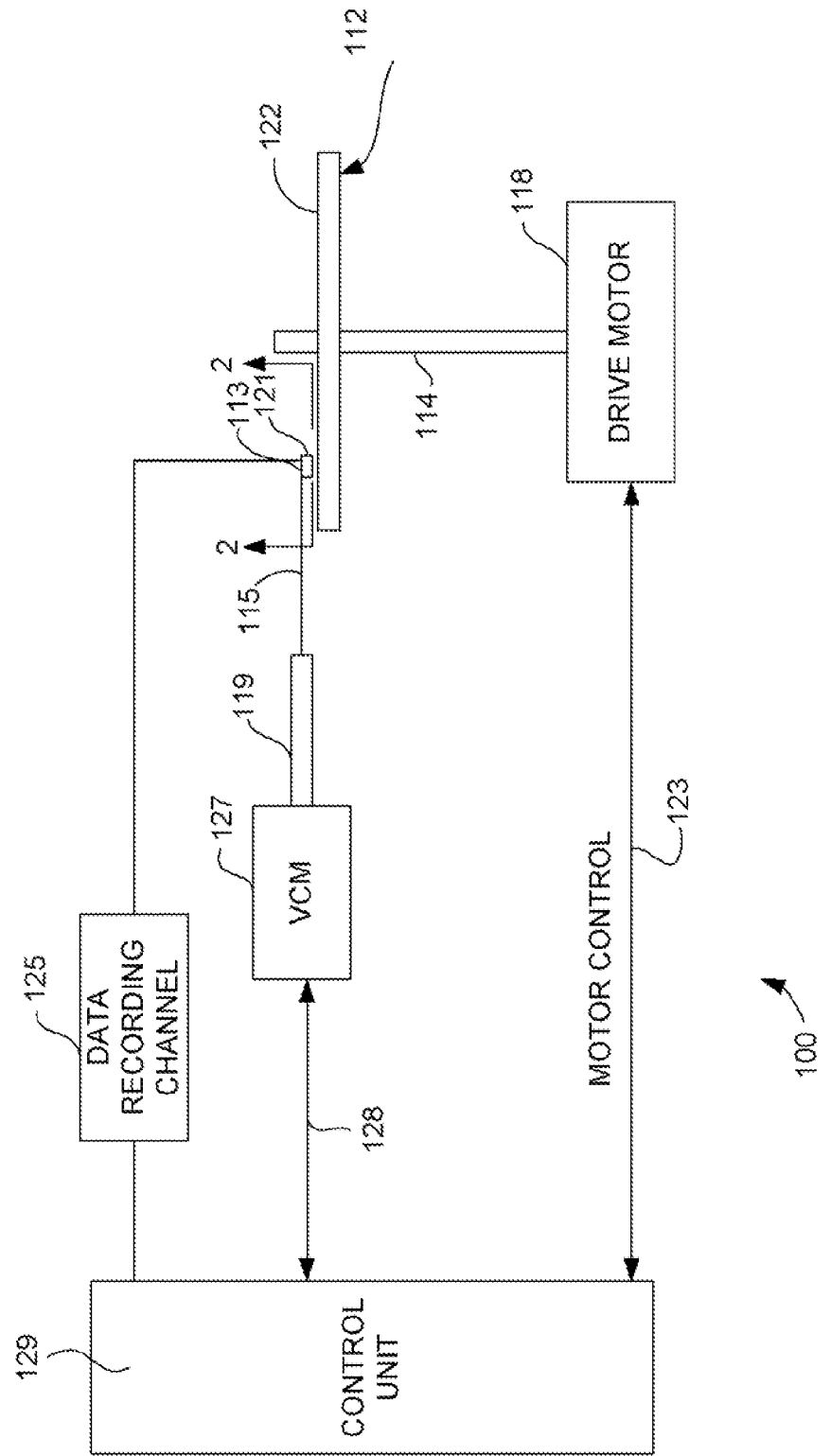
FIG. 1 is a schematic illustration of a magnetic disk drive in which this invention might be embodied.

Referring now to FIG. 1, there is shown a magnetic disk drive 100 embodying this invention. As shown in FIG. 1, at least one rotatable magnetic disk 112 is supported on a spindle 114 and rotated by a disk drive motor 118. The magnetic recording is performed on each magnetic disk 112.

At least one slider 113 is positioned near the magnetic disk 112, each slider 113 supporting write and read heads 121. As the magnetic disk 112 rotates, the slider 113 moves radially in and out over the disk surface 122 so that the write and read heads 121 may access different tracks of the magnetic disk 112. Each slider 113 is attached to an actuator arm 119 by way of a suspension 115. The suspension 115 provides a slight spring force which biases the slider 113 against the disk surface 122. Each actuator arm 119 is attached to an actuator means 127. The actuator means 127 may be a voice coil motor (VCM). The VCM comprises a coil movable within a fixed magnetic field, the direction and speed of the coil movements being controlled by the motor current signals supplied by a control unit 129.

During operation of the magnetic disk drive 100, the rotation of the magnetic disk 112 generates an air bearing between the slider 113 and the disk surface 122 which exerts an upward force or lift on the slider 113. The air bearing thus counter-balances the slight spring force of the suspension 115 and supports the slider 113 off and slightly above the disk surface 122 by a small, substantially constant spacing during operation.

The various components of the magnetic disk drive 100 are controlled in operation by control signals generated by the control unit 129, such as access control signals and internal clock signals. Typically, the control unit 129 comprises logic control circuits, storage means and a microprocessor. The control unit 129 generates control signals to control various operations such as drive motor control signals on line 123 and head position and seek control signals on line 128. The control signals on line 128 provide desired current profiles to optimally move and position the slider 113 to the desired data track on the magnetic disk 112. Write and read signals are communicated to and from write and read heads 121 by way of a recording channel 125.

Figure 2:
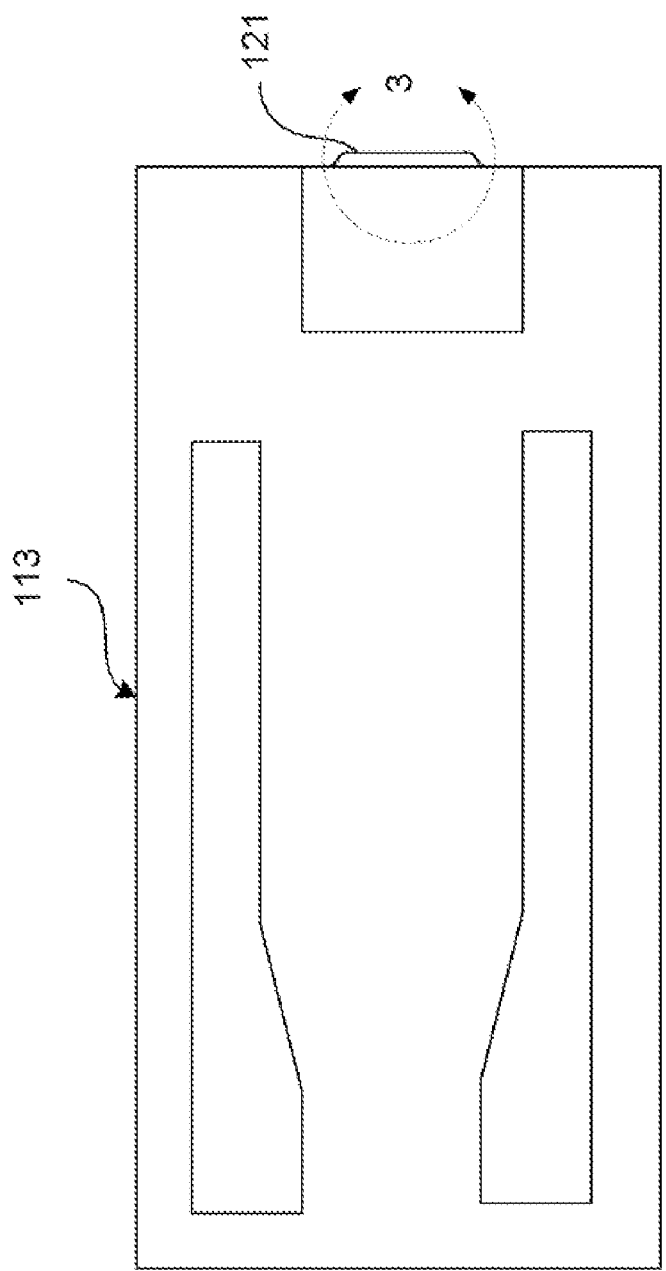
FIG. 2 is an ABS view of a slider, taken from line 2-2 of FIG. 1, illustrating the location of write and read heads thereon.

With reference to FIG. 2, the orientation of the write and read heads 121 in the slider 113 can be seen in more detail. FIG. 2 is an ABS view of the slider 113, and as can be seen, the write and read heads 121 are located at a trailing edge of the slider 113. The above description of a typical magnetic disk drive 100, and the accompanying illustration of FIG. 1 are for representation purposes only. It should be apparent that the magnetic disk drive may contain a large number of magnetic disks and actuators, and each actuator may support a number of sliders.

Figure 3:
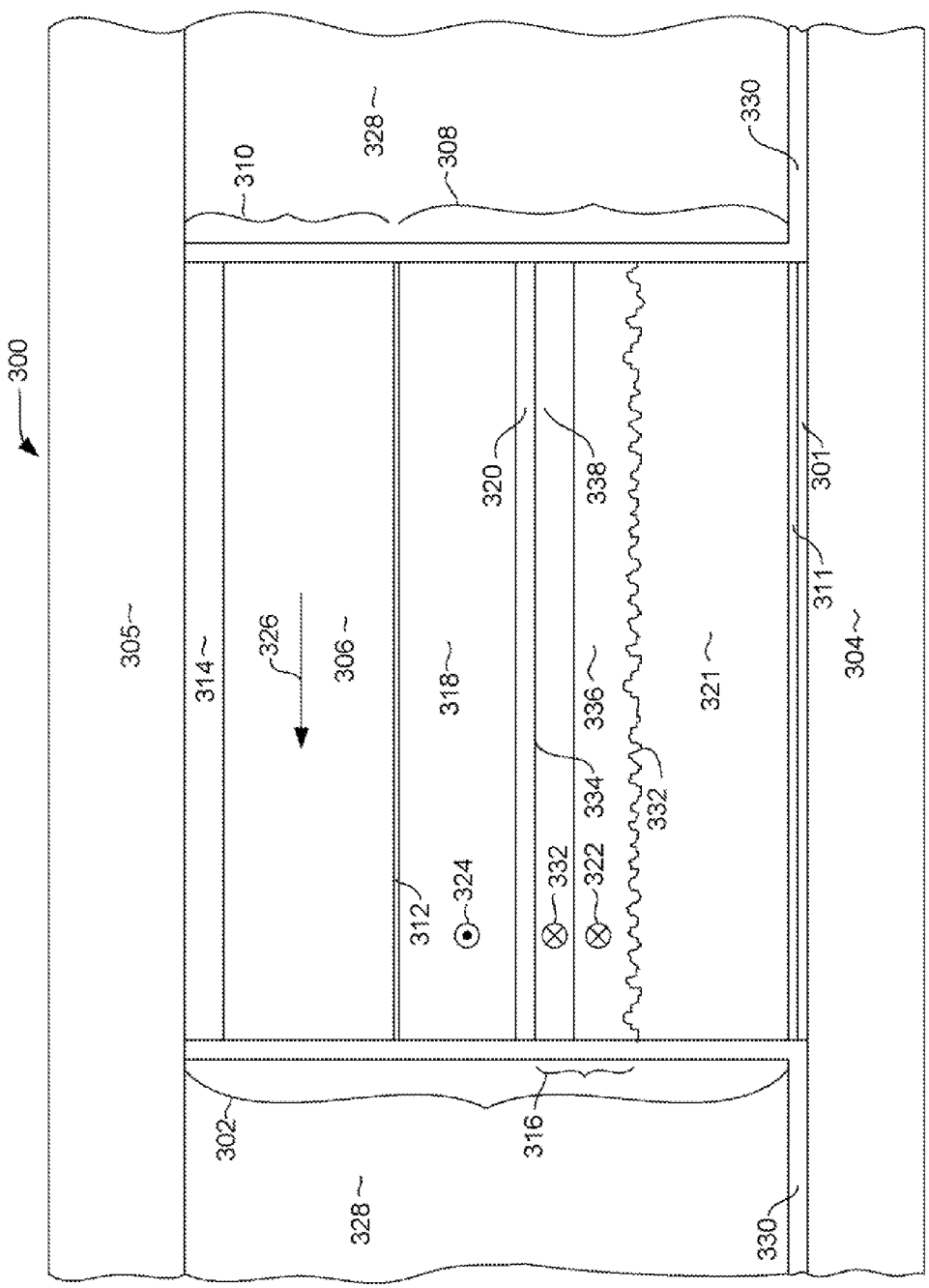
FIG. 3 is an ABS view of a CPP TMR sensor according to an embodiment of the invention taken from circle 3 of FIG. 2.

With reference now to FIG. 3, a read head 300 comprises a CPP TMR or GMR sensor 302 sandwiched between first and second electrodes 304, 305, and electrically insulated by an insulator 330 from longitudinal bias stack 328 in each of two side regions. The first and second electrodes 304, 305 can be made of approximately 1 μm thick ferromagnetic Ni—Fe alloy films, which also function as magnetic shields. The insulator 330 can be made of a 6 nm thick nonmagnetic $Al_2O_3$ film, while the longitudinal bias stack 328 can be made of a 6 nm thick nonmagnetic Cr film and a 20 nm thick hard-magnetic Co—Pt—Cr alloy film.

The CPP TMR or GMR sensor 302 includes a nonmagnetic barrier or spacer layer 312 overlying a lower structure 308 and underlying an upper structure 310. The barrier layer 312 can be made of a 1 nm thick electrically insulating $AlO_x$, $TiO_x$, or $MgO_x$ films, while the spacer layer 312 can be made of a 3 nm thick electrically conducting Cu film wherein some oxygen is incorporated, and wherein an electrically insulating Co—Fe oxide, $AlO_x$ or $SiO_x$ film can also be incorporated. The lower structure 308 comprises a 3 nm thick nonmagnetic Ta adhesion layer 301, a 1.6 nm thick nonmagnetic Ru seed layer 311, a 6 nm thick antiferromagnetic 25.2% Ir-70.6% Mn-4.2% Cr (all concentrations cited herein are in atomic percent) alloy pinning layer 321, a 1.1 nm thick ferromagnetic amorphous 52.6% Co-33.1% Fe-14.3% B alloy lower keeper layer 336, a 1.1 nm thick ferromagnetic polycrystalline 77.5% Co-22.5% Fe alloy upper keeper layer 338, a 0.8 nm thick nonmagnetic Ru spacer layer 320, and a 1.9 nm thick ferromagnetic 52.6% Co-33.1% Fe-14.3% B alloy reference layer 324. The upper structure 310 comprises a 2.9 nm thick ferromagnetic 80.3 Co-10.5% Fe-9.2% B alloy sense layer 306 and a 6 nm thick nonmagnetic Ta cap layer 314.

For most of the cases discussed herein, the Co—Fe—B, Co—Fe, and Ir—Mn—Cr alloys were deposited from 50% Co-34% Fe-15% B, 75% Co-25% Fe, and 22% Ir-75% Mn-3% Cr alloy sputtering targets. With particular reference to the data presented in FIGS. 5, 6, 7, 8 and 9, these targets produced alloy layers of Co—Fe—B, Co—Fe, and Ir—Mn—Cr alloys with the following nominal compositions: 52.6% Co-33.1% Fe-14.3% B, 77.5% Co-22.5% Fe, and 25.2% Ir-70.6% Mn-4.2% Cr, respectively. Thus, data labeled Co—Fe—B, Co—Fe, and Ir—Mn—Cr in FIGS. 5, 6, 7, 8 and 9 were for alloy layers having approximately the atomic concentrations for these elemental constituents indicated above.

To ensure proper sensor operation, magnetizations of the Co—Fe—B/Co—Fe alloy dual keeper 336/338 layers and the Co—Fe—B alloy reference layer 324 must be rigidly pinned in opposite transverse directions 322, 324 perpendicular to the ABS, while the magnetization of the Co—Fe—B alloy sense layer 306 is preferably oriented in a longitudinal direction 326 parallel to the ABS after applying a sense current.

This rigid pinning is achieved through a high $H_{UA}$ induced by exchange coupling between the antiferromagnetic Ir—Mn—Cr alloy pinning layer 321 and the amorphous ferromagnetic Co—Fe—B alloy keeper layer 336 in a transverse direction 322, and through a high induced antiparallel coupling field $H_{AP}$ between the ferromagnetic Co—Fe alloy keeper and Co—Fe—B alloy reference layers 338, 318 across the Ru spacer layer 320 in two opposite transverse directions 322, 324. To achieve optimal TMR responses, a demagnetizing field $H_D$ induced by the net magnetic moment of the Co—Fe—B/Co—Fe alloy dual keeper layers 336/338 and the Co—Fe—B alloy reference layer 324 must balance with a ferromagnetic coupling field $H_F$ across the $MgO_x$ barrier layer 312. This field balance is preferably achieved with low $H_D$ and $H_F$ to minimize non-uniform field distributions particularly at sensor edges.

In the past, it was believed that, even though a polycrystalline antiferromagnetic film can exchange-couple to a polycrystalline ferromagnetic film, it would be unable to exchange-couple to an amorphous ferromagnetic film. However, it has been found in this invention that a polycrystalline antiferromagnetic Ir—Mn—Cr alloy film can strongly exchange-couple to an amorphous ferromagnetic Co—Fe—B alloy film by properly selecting its composition. This effect allows one to take advantage of a strong exchange coupling, while obtaining the benefit of the amorphous ferromagnetic Co—Fe—B alloy film to planarize the rough surface topography that would otherwise be produced on the surface of the keeper layer induced by the rough surface of the underlying polycrystalline antiferromagnetic Ir—Mn—Cr alloy film. The implementation of this invention in a $MgO_x$ TMR sensor to improve TMR properties is described herein below in greater detail.

Figure 4:
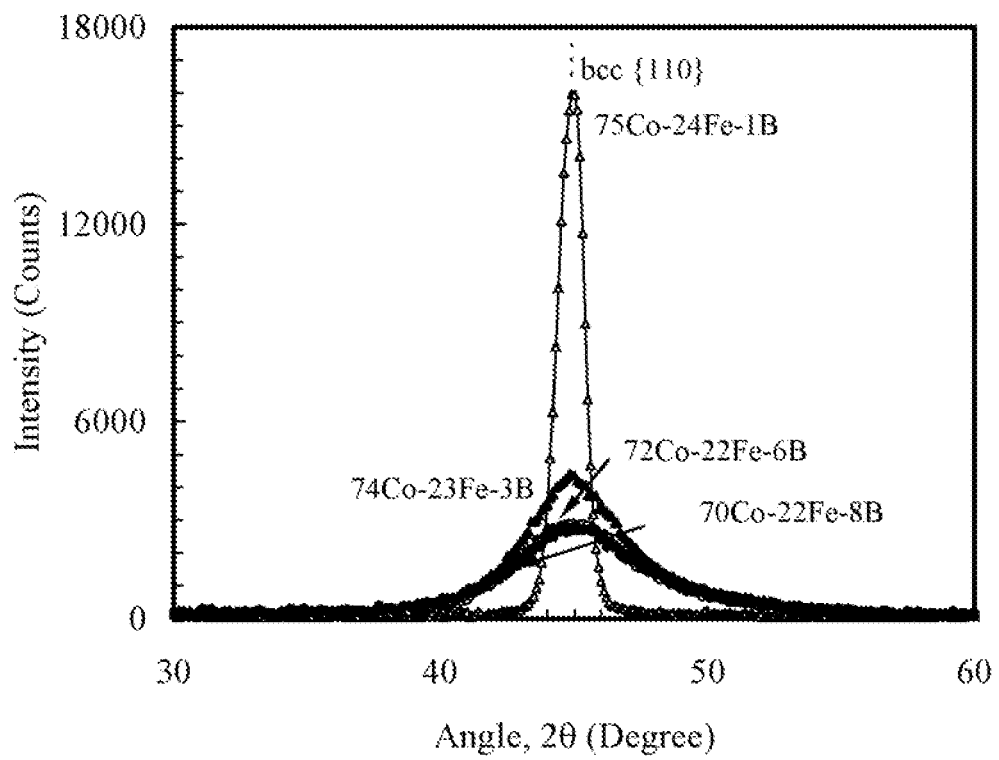
FIG. 4 is a graph of diffractometer traces of the (110) line of ~16 nm thick Co—Fe—B alloy films with boron contents ranging from 0 to 8 atomic percent, showing that the addition of the boron element with a content as small as 3 atomic percent into the Co—Fe alloy film causes a transformation from polycrystalline to amorphous (or nano-crystalline) phases.

FIG. 4 shows diffractometer traces of the (110) line of ~16 nm thick Co—Fe—B alloy films with boron contents ranging from 0 to 8 at %. For a 1% B concentration, diffraction peaks appear for the Co—Fe {110}, Co—Fe {200} and Co—Fe {211} crystal planes (the latter two not shown). The addition of the boron element with a content of as low as 3 atomic percent into the polycrystalline ferromagnetic Co—Fe alloy film causes a substantial reduction in a grain size from 9.5 to 2.5 nm in diameter, as determined from broadening of the {110} diffraction peak seen in FIG. 4, indicating a transformation from polycrystalline to amorphous (or nano-crystalline) phases. Increased broadening of the {110} peak is seen with increasing B content of up to 8%. At B concentrations greater than 8%, of 10% and event 15%, the peak at the {110} position essentially overlays that for the 8% alloy, indicating that for B concentrations above 8%, such alloys have essentially the same amorphous (or nano-crystalline) microstructures with a less than 1.5 nm correlation length. Moreover, diffraction peaks for alloys with 3% or greater B content at the {200} and {211} reflection positions (not shown) essentially disappear, giving further evidence of an amorphous (or nano-crystalline) microstructure for Co—Fe—B alloys having B concentrations greater than or equal to 3%. To prevent the amorphous ferromagnetic Co—Fe—B alloy film from re-crystallizing during annealing, a boron content exceeding 10 atomic percent is preferably selected since the re-crystallization temperature increases with the boron content, and the annealing temperature needed to develop good TMR properties is substantially reduced from 360 to 285° C.

Figure 5:
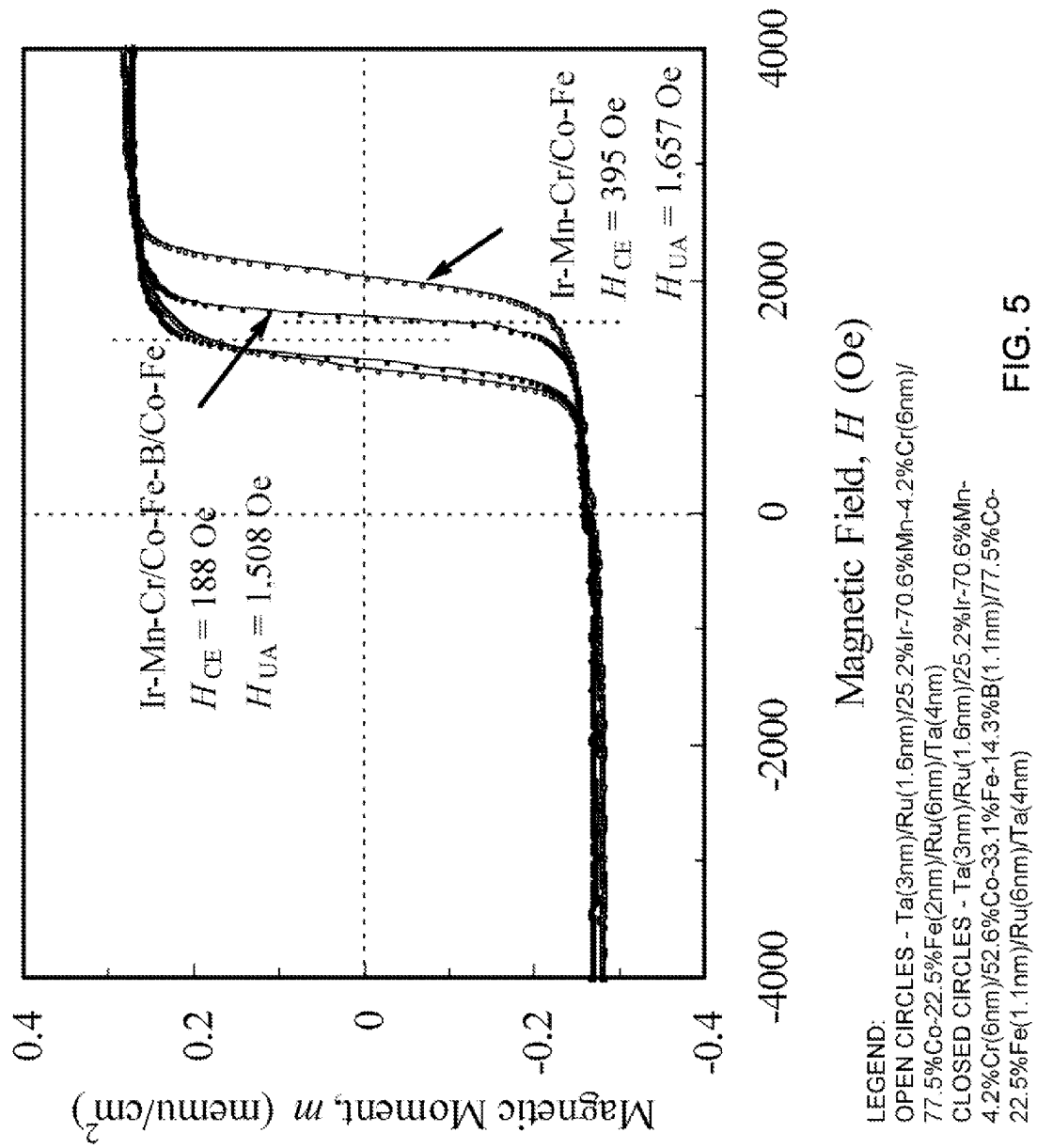
FIG. 5 is a graph of easy-axis responses of Ta(3 nm)/Ru(1.6 nm)/Ir—Mn—Cr(6 nm)/Co—Fe(2 nm)/Ru(6 nm)/Ta(4 nm) and Ta(3 nm)/Ru(1.6 nm)/Ir—Mn—Cr(6 nm)/Co—Fe—B (1.1 nm)/Co—Fe(1.1 nm)/Ru(6 nm)/Ta(4 nm) films, exhibiting comparable unidirectional anisotropy fields ($H_{UA}$)

FIG. 5 shows easy-axis responses of Ta(3 nm)/Ru(1.6 nm)/25.2% Ir-70.6% Mn-4.2% Cr (6 nm)/77.5% Co-22.5% Fe(2 nm)/Ru(66 nm)/Ta(4 nm) and Ta(3 nm)/Ru(1.6 nm)/25.2% Ir-70.6% Mn-4.2% Cr(6 nm)/52.6% Co-33.1% Fe-14.3% B (1.1 nm)/77.5% Co-22.5% Fe(1.1 nm)/Ru(6 nm)/Ta(4 nm) films after annealing for 5 hours at 285° C. It is surprising to find that, even with the addition of Cr at as high a concentration as 4.2 atomic percent to the Ir—Mn alloy pinning layer to ensure good corrosion resistance, and the addition of boron at as high a concentration as 14.3 atomic percent to the Co—Fe alloy lower keeper layer to ensure the formation of a stable amorphous phase, strong exchange coupling still occurs between the Ir—Mn—Cr alloy pinning layer and Co—Fe—B alloy lower keeper layer. As shown in FIG. 5, the Ir—Mn—Cr alloy pinning layer and Co—Fe alloy keeper layer exhibits an $H_{UA}$ of as high as 1,657 Oe (corresponding to an exchange energy, $J_K$, of as high as 0.47 erg/cm$^2$) and an $H_{CE}$ of as high as 395 Oe. On the other hand, the Ir—Mn—Cr alloy pinning layer and Co—Fe—B alloy lower keeper layer exhibit and $H_{UA}$ of as high as 1,508 Oe (corresponding to a $J_K$ of as high as 0.41 erg/cm$^2$) and an $H_{CE}$ of as low as 188 Oe. The addition of 14.2 at % B results in a reduction in $H_{UA}$ by an amount as small as 9%, but in $H_{CE}$ by, as large as 52%. While the comparably high $H_{UA}$ still ensures rigid pinning, the very low $H_{CE}$ and higher squareness of the hysteresis loop (as shown in FIG. 5) ensure a minimal hysteretic magnetization rotation.

Figure 6:
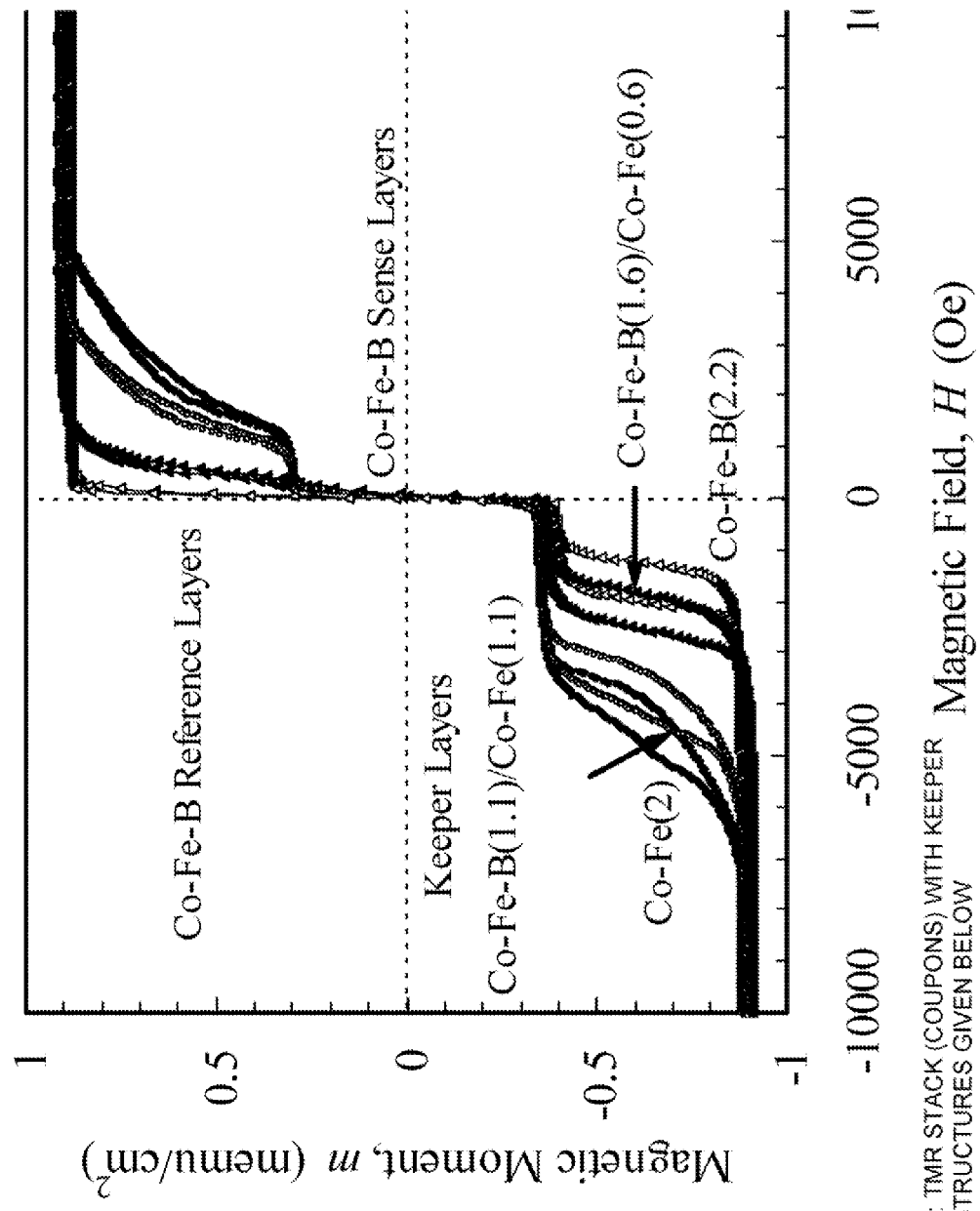
FIG. 6 is a graph of easy-axis responses of TMR sensors with Co—Fe(2 nm),Co—Fe—B(1.6 nm)/Co—Fe(0.6 nm), Co—Fe—B(1.1 nm)/Co—Fe(1.1 nm) and Co—Fe—B(2.2 nm) alloy keeper layers after annealing for 5 hours at 285° C.

However, the Co—Fe—B alloy lower keeper layer preferably should not be placed in contact with the Ru spacer layer, because antiparallel coupling between the keeper and reference layers will suffer. FIG. 6 shows easy-axis responses of TMR sensors after annealing for 5 hours at 285° C. for several keeper layer structures: Co—Fe (2 nm), Co—Fe—B (1.6 nm)/Co—Fe(0.6 nm), Co—Fe—B(1.1 nm)/Co—Fe(1.1 nm) and Co—Fe—B(2.2 nm). While the antiparallel coupling occurs in the Co—Fe/Ru/Co—Fe—B films, it completely disappears in the Co—Fe—B/Ru/Co—Fe—B films. Thus, the Co—Fe alloy upper layer of the dual keeper layer structure is needed to ensure high antiparallel coupling. In addition, it must be thick enough to ensure strong antiparallel coupling.

Figure 7:
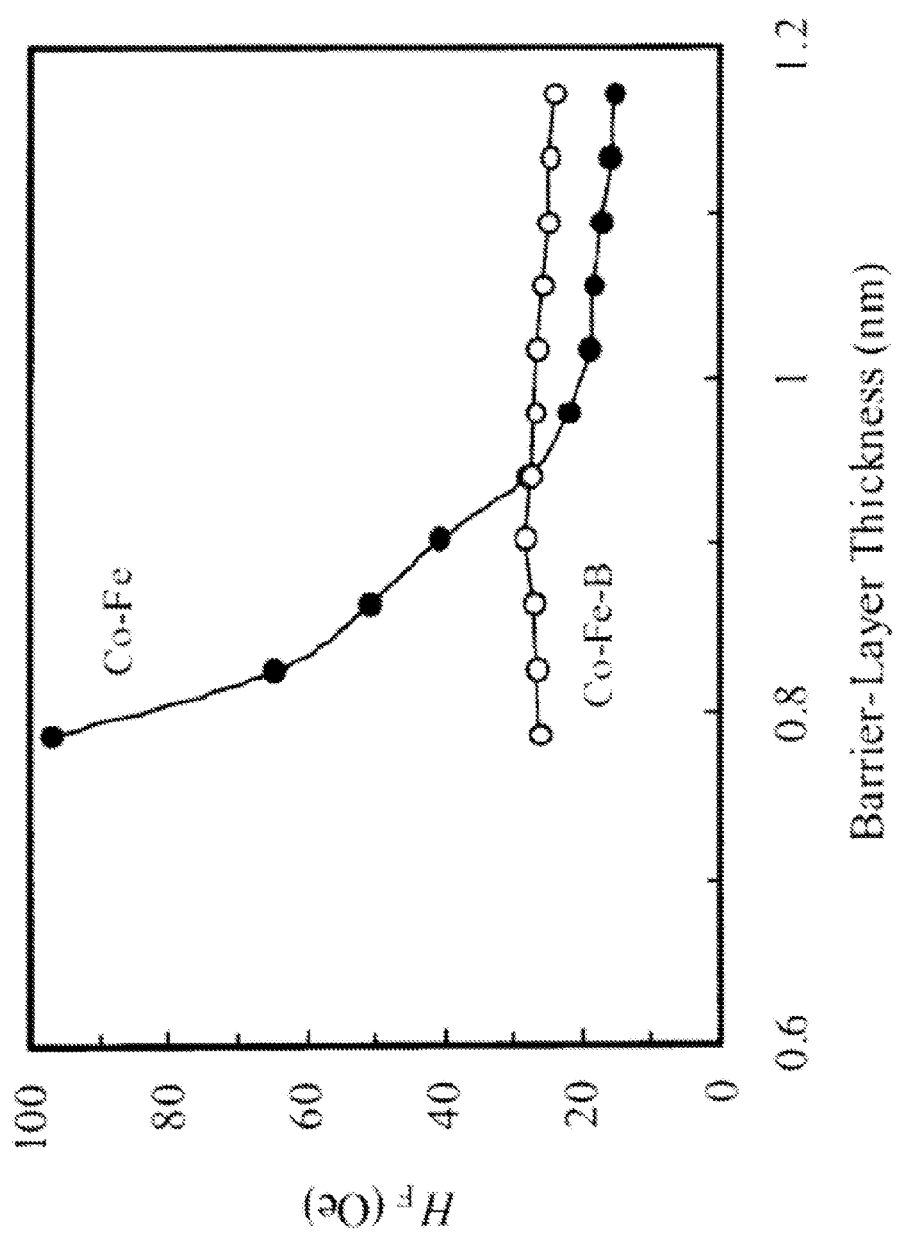
FIG. 7 is a graph of $H_F$ versus barrier layer thickness for sensors with Co—Fe alloy and Co—Fe—B alloy keeper layers.

With reference now to FIG. 7, an advantage of the invention is a substantial reduction in a ferromagnetic coupling field ($H_F$). FIG. 7 shows $H_F$ versus barrier layer thickness. Indeed, $H_F$ is substantially reduced when a Co—Fe—B alloy film replaces a Co—Fe alloy film as a keeper layer. As a result, a thinner barrier layer can be used, leading to a lower junction resistance-area product ($R_J A_J$). A smoother barrier layer can, therefore, be attained, leading to a higher TMR coefficient. AP pinning is weak in this structure. However, with modified composition of the Co—Fe—B keeper layer the AP pinning can be improved. Alternatively, the AP pinning can be improved by using a crystalline Co—Fe alloy layer on top of the Co—Fe—B alloy keeper layer in a dual keeper layer structure, as in an embodiment of the invention.

Figure 8:
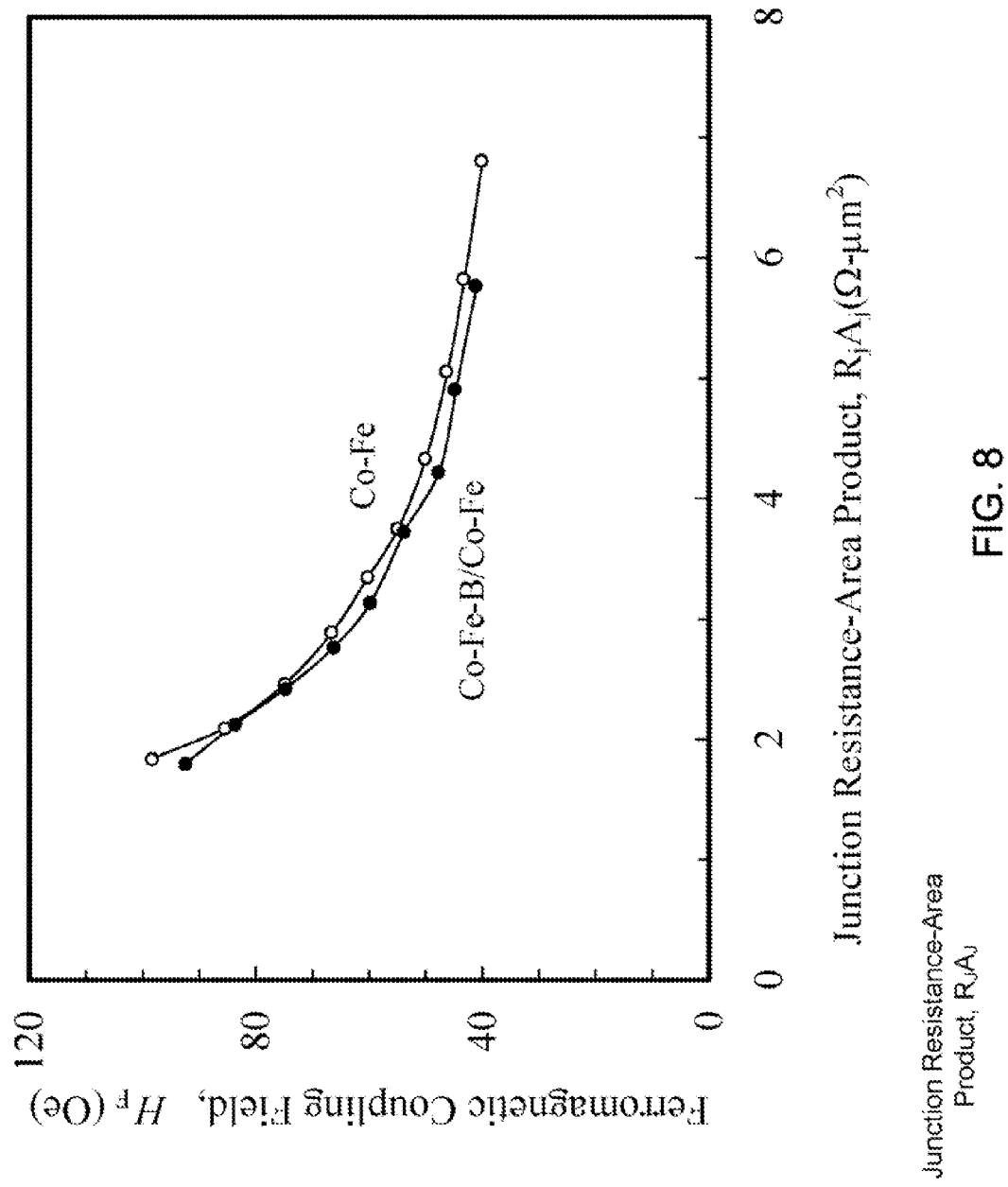
FIG. 8 is a graph of $H_F$ versus $R_J A_J$ for the $MgO_x$ TMR sensors with Co—Fe alloy and Co—Fe—B/Co—Fe alloy keeper layers.

With reference now to FIG. 8, it can be seen that this invention provides a planarization technique leading to a flat $MgO_x$ barrier layer as indicated by a substantial decrease in $H_F$. FIG. 8 shows $H_F$ versus $R_J A_J$ for the $MgO_x$ TMR sensors with Co—Fe alloy and Co—Fe—B/Co—Fe alloy keeper layers. Since the $MgO_x$ TMR sensors are annealed at 285° C., much lower than 360° C. used in the prior art, both the Co—Fe—B alloy lower and Co—Fe—B alloy reference layers may remain amorphous. As a result, the replacement of the Co—Fe alloy reference with the Co—Fe—B alloy reference layer has caused a substantial decrease in $H_F$; but, the replacement of the Co—Fe alloy keeper layer with the Co—Fe—B/Co—Fe alloy dual layer just causes a mild decrease in $H_F$.

Figure 9:
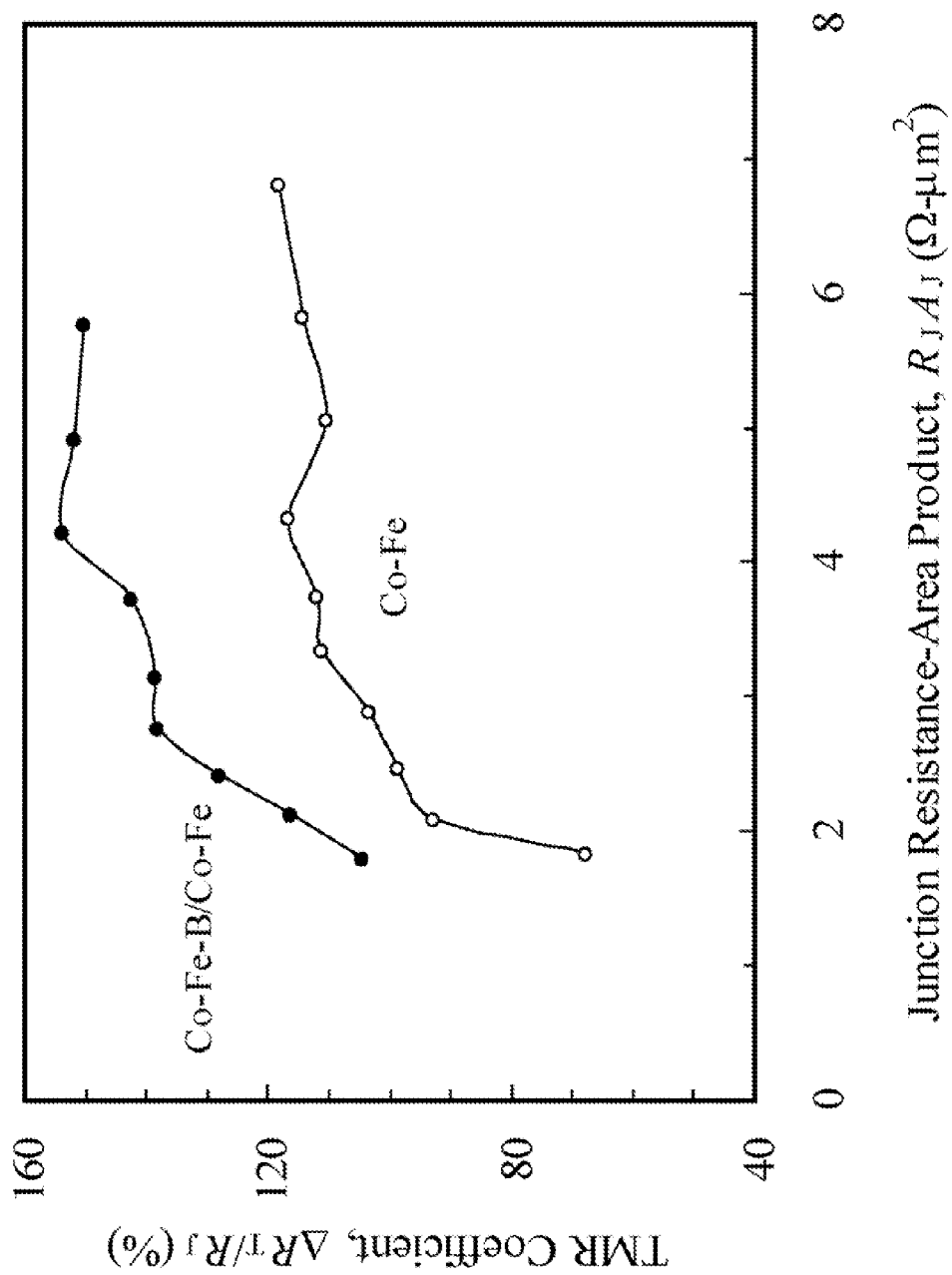
FIG. 9 is a graph of $\Delta R_T/R_J$ versus $R_J A_J$ for the $MgO_x$ TMR sensors with Co—Fe alloy and Co—Fe—B/Co—Fe alloy keeper layers.

With reference now to FIG. 9, it can be seen that the flat $MgO_x$ barrier layer provided by the planarization technique of this invention also results in a substantial increase in $\Delta R_T/R_J$. FIG. 9 shows $\Delta R_T/R_J$ versus $R_J A_J$ for the $MgO_x$ TMR sensors with Co—Fe alloy and Co—Fe—B/Co—Fe alloy keeper layer structures. Indeed, $\Delta R_T/R_J$ substantially increases when the Co—Fe—B/Co—Fe alloy dual keeper layer structure replaces the Co—Fe alloy keeper layer. For example, with $R_J A_J = 3 \Omega\text{-}\mu m^2$, $\Delta R_T/R_J$ increases from 100% to 120%.

The amorphous ferromagnetic lower keeper layer can also be made of Co—Fe—X alloy film, where X is a third elemental constituent having an atomic size that produces an amorphous microstructure. For such Co—Fe—X alloys having an amorphous microstructure, results similar to those obtained with Co—Fe—B alloys are expected, for example, when the third elemental constituent has a significantly larger atomic size than the Co or Fe: such as Hf, Y, Zr, etc.

While various embodiments have been described above, it should be understood that they have been presented by way of example only, and not limitation. For example, the invention has been described in terms of a tunnel junction sensor, TMR, however, it should be appreciated that this is for purposes of illustration only. The present invention can also be embodied in another type of sensor such as a current in plane giant magnetoresistive sensor (CIP GMR) or current perpendicular to plane giant magnetoresistive sensor (CPP GMR). Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
a nonmagnetic layer overlying a lower structure and underlying an upper structure;
the upper structure comprising a ferromagnetic sense layer;
the lower structure comprising:
an antiferromagnetic pinning layer;
a ferromagnetic dual keeper layer structure;
a ferromagnetic reference layer; and
a nonmagnetic anti-parallel coupling layer sandwiched between the dual keeper layer structure and the reference layer; wherein
the dual keeper layer structure comprises an amorphous magnetic layer that is exchange coupled with the antiferromagnetic pinning layer, and a polycrystalline magnetic layer adjacent to the anti-parallel coupling layer.

2. A sensor as in claim 1 wherein the amorphous layer of the dual keeper layer structure comprises a Co—Fe—B alloy.

3. A sensor as in claim 1 wherein the amorphous layer of the dual keeper layer structure comprises a Co—Fe—B alloy film with an Fe content of 10 to 50 atomic percent and a B content of 2 to 40 atomic percent.

4. A sensor as in claim 1 wherein the amorphous layer of the dual keeper layer structure comprises a Co—Fe—X alloy having 10 to 50 atomic percent Fe and 2-20 atomic percent X, wherein X comprises an elemental constituent selected from the group consisting of Hf, Y and Zr.

5. A sensor as in claim 1 wherein the polycrystalline ferromagnetic layer of the dual keeper layer structure comprises a Co—Fe alloy with an Fe content of 10 to 50 atomic percent.

6. A sensor as in claim 1 wherein the non-magnetic layer underlying the upper structure and overlying the lower structure is an electrically insulating barrier layer.

7. A sensor as in claim 1 wherein the non-magnetic layer overlying the lower structure and overlying the upper structure is an electrically conductive spacer layer.

8. A sensor as in claim 1 further comprising a nonmagnetic adhesion layer comprising Ta and a seed layer, the seed layer being sandwiched between the antiferromagnetic pinning layer and the adhesion layer.

9. A sensor as in claim 1 further comprising a nonmagnetic adhesion layer comprising Ta and a seed layer comprising Ru sandwiched between the antiferromagnetic pinning layer and the adhesive layer.

10. A sensor as in claim 1 wherein the antiferromagnetic pinning layer comprises a material selected from the group consisting of an Ir—Mn alloy and an Ir—Mn—Cr alloy.

11. A sensor as in claim 1 wherein the anti-parallel coupling layer comprises Ru.

12. A sensor as in claim 1 wherein the ferromagnetic reference layer comprises a Co—Fe—B alloy.

13. A sensor as in claim 1 wherein the ferromagnetic sense layer comprises a Co—Fe—B alloy.

14. A sensor as in claim 1 wherein the upper structure further comprises a nonmagnetic cap layer formed over the sense layer.

15. A sensor as in claim 14 wherein the cap layer comprises Ta.

16. A sensor as in claim 1 wherein the amorphous layer of the dual keeper layer structure comprises a Co—Fe—X alloy, wherein X is an elemental constituent having an atomic size that is significantly larger than those of Co and Fe.

17. A magnetoresistive sensor, comprising:
a layer antiferromagnetic material (AFM) comprising an Ir—Mn—Cr alloy;
a magnetic keeper layer structure comprising a layer of amorphous magnetic material that is exchange coupled with the AFM layer;
a magnetic reference layer; and
a non-magnetic antiparallel coupling layer sandwiched between the magnetic keeper layer structure and the magnetic reference layer;
wherein the amorphous magnetic comprises a Co—Fe—X alloy wherein X comprises an elemental constituent selected from the group consisting of Hf, Y, and Zr.

18. A sensor as in claim 17 further comprising a barrier layer formed on the reference layer wherein the barrier layer has a thickness less than 1 nm.

19. A magnetoresistive sensor, comprising:
a layer of antiferromagnetic material (AFM) comprising an Ir—Mn—Cr alloy;
a magnetic keeper layer structure comprising a layer of amorphous magnetic material that is exchange coupled with the AFM layer;
a magnetic reference layer; and
a non-magnetic antiparallel coupling layer sandwiched between the magnetic keeper layer structure and the magnetic reference layer;
wherein the keeper layer further comprises a layer of polycrystalline, magnetic material disposed between the amorphous layer and the non-magnetic antiparallel coupling layer.

20. A sensor as in claim 19 wherein the amorphous magnetic material comprises a Co—Fe—B alloy.

21. A magnetic data recording system, comprising:
a housing;
a magnetic medium rotatably mounted within the housing;
a slider;
an actuator for moving the slider adjacent to a surface of the magnetic medium; and
a magnetoresistive sensor connected with the slider, the magnetoresistive sensor further comprising:
a nonmagnetic layer overlying a lower structure and underlying an upper structure;
the upper structure comprising a ferromagnetic sense layer;
the lower structure comprising:
an antiferromagnetic pinning layer;
a ferromagnetic dual keeper layer structure;
a ferromagnetic reference layer; and
a nonmagnetic anti-parallel coupling layer sandwiched between the dual keeper layer structure and the reference layer; wherein
the dual keeper layer structure comprises an amorphous magnetic layer that is exchange coupled with the antiferromagnetic pinning layer, and a polycrystalline magnetic layer adjacent to the anti-parallel coupling layer.

22. A magnetic data recording system, comprising:
a housing;
a magnetic medium rotatably mounted within the housing;
a slider;
an actuator for moving the slider adjacent to a surface of the magnetic medium; and
a magnetoresistive sensor connected with the slider, the magnetoresistive sensor further comprising:
a layer of antiferromagnetic material (AFM) comprising an Ir—Mn—Cr alloy;
a magnetic keeper layer structure comprising a layer of amorphous magnetic material that is exchange coupled with the AFM layer;
a magnetic reference layer; and
a non-magnetic antiparallel coupling layer sandwiched between the magnetic keeper layer structure and the magnetic reference layer;
wherein the amorphous magnetic material comprises a Co—Fe—X alloy wherein X comprises an elemental constituent selected from the group consisting of Hf, Y and Zr.

* * * * *

UNITED STATES PATENT AND TRADEMARK OFFICE
CERTIFICATE OF CORRECTION

| | |
|---|---|
| PATENT NO. | : 7,672,089 B2 |
| APPLICATION NO. | : 11/611828 |
| DATED | : March 2, 2010 |
| INVENTOR(S) | : Tsann Lin |

It is certified that error appears in the above-identified patent and that said Letters Patent is hereby corrected as shown below:

In claim 9, column 8, line 58, please replace "adhesive" with --adhesion--.

In claim 17, column 9, line 11, between "a layer" and "antiferromagnetic", please insert --of--.

In claim 17, column 9, line 19, between "amorphous magnetic" and "comprises", please insert --material--.

In claim 17, column 9, line 21, between "consisting of Hf, Y" and "and Zr." please delete ",".

Signed and Sealed this
Fourth Day of January, 2011

David J. Kappos
*Director of the United States Patent and Trademark Office*